(12) United States Patent
Sin et al.

(10) Patent No.: US 6,353,318 B1
(45) Date of Patent: Mar. 5, 2002

(54) MAGNETORESISTIVE SENSOR HAVING HARD BIASED CURRENT PERPENDICULAR TO THE PLANE SENSOR

(75) Inventors: Kyusik Sin, Palo Alto; Yingjian Chen; Ningja Zhu, both of Fremont, all of CA (US); Bill Crue, Pittsburgh, PA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/523,587

(22) Filed: Mar. 10, 2000

(51) Int. Cl.$^7$ ............................................... G01R 33/02
(52) U.S. Cl. ..................................... 324/252; 360/324.2
(58) Field of Search ...................... 324/207.21, 207.24, 324/207.25, 252, 360; 338/32 H, 32 R; 360/313, 324, 320, 324.1, 324.11, 324.12, 324.2, 327.1, 314

(56) References Cited

U.S. PATENT DOCUMENTS

| | | | |
|---|---|---|---|
| 5,018,037 A | 5/1991 | Krounbi et al. | 360/327.31 |
| 5,434,826 A | 7/1995 | Ravipati et al. | 367/140 |
| 5,436,777 A * | 7/1995 | Soeya et al. | 360/113 |
| 5,532,892 A | 7/1996 | Nix et al. | 360/327.31 |
| 5,646,805 A | 7/1997 | Shen et al. | 360/327.1 |
| 5,742,459 A | 4/1998 | Shen et al. | 360/327.32 |
| 5,748,416 A | 5/1998 | Tobise et al. | 360/324.12 |
| 5,754,376 A | 5/1998 | Kobayashi et al. | 360/324.31 |
| 5,805,389 A | 9/1998 | Saito et al. | 360/327.32 |
| 5,835,314 A | 11/1998 | Moodera et al. | 360/324.2 |
| 5,898,547 A | 4/1999 | Fontana, Jr. et al. | 360/324.2 |
| 5,898,548 A * | 4/1999 | Dill et al. | 360/113 |
| 5,898,549 A | 4/1999 | Gill | 360/324.11 |
| 6,185,081 B1 * | 2/2001 | Simion et al. | 360/327.3 |

* cited by examiner

*Primary Examiner*—Jay Patidar
(74) *Attorney, Agent, or Firm*—Carr & Ferrell LLP; John S. Ferrell; Robert D. Hayden

(57) ABSTRACT

The apparatus of the present invention is embodied in a magnetic field sensor having a magnetoresistive element, a magnetic bias layer for biasing the magnetoresistive element with a magnetic field, and an electrical insulator positioned between the magnetic bias layer and the magnetoresistive element. The insulator prevents the flow of electrical current between the magnetoresistive element and the magnetic bias layer and at least a portion of the insulator allows passage of the magnetic field from the magnetic bias layer to the magnetoresistive element such that the magnetoresistive element is biased. The method of the present invention is embodied in a method for fabricating a magnetic field sensor having the steps of forming a magnetoresistive element, forming a lower insulator with a main section and an end section over at least a portion of the magnetoresistive element, forming a magnetic bias layer over the main section of the lower insulator, and forming an upper insulator over the magnetic bias layer and over the end section of the lower insulator, such that the magnetic bias layer is electrically insulated from the magnetoresistive element.

9 Claims, 7 Drawing Sheets

MAGNETORESISTIVE SENSOR HAVING HARD BIASED CURRENT PERPENDICULAR TO THE PLANE SENSOR

BACKGROUND

Computer storage devices, such as disk drives, use read/write heads to store and retrieve data. A write head stores data by utilizing magnetic flux to set the magnetic moment of a particular area on a magnetic media. The state of the magnetic moment is later read by a read head which senses the magnetic fields.

Conventional thin film read heads employ magnetoresistive material, generally formed in a layered structure of magnetoresistive and non-magnetoresistive materials, to detect the magnetic moments of the data bits on the media. A sensing current is passed through the magnetoresistive material to detect changes in the resistance of the material induced by the data bits as they pass the read head.

One conventional type of sensor is a current-in-plane or CIP device as shown in FIG. 1. As can be seen, this sensor 5 has a junction 10, hard bias 40 and leads 50. The junction 10 is a stack of film layers which includes, from the bottom, an antiferromagnet layer 12, a pinned layer 14, a copper spacer layer 16 and at the top of the stack a free layer 18. The junction 10 has sloping sides 11. Typically, the pinned layer 14 is a ferromagnetic layer which, as the name implies, has its magnetization pinned by the antiferromagnetic layer 12. The free layer 18, in contrast is a ferromagnetic layer which has its magnetization set perpendicular to the pinned layer 14, and which is free to change its magnetic orientation in response to a magnetic fields of passing magnetized bits located on an adjacent recording media (not shown).

The hard bias 40 is positioned on both sides of the junction 10. The hard bias 40 includes an underlayer 42, which can be chromium (Cr), and a permanent magnet layer 46, such as cobalt chromium platinum (CoCrPt). The underlayer 42 is laid directly over each side 11 of the junction 10, and the permanent magnet layer 46 is positioned over the underlayer 42. Both the underlayer 42 and the permanent magnet layer 46 overhang and contact the upper surface 20 of the free layer 18. The underlayer 42 contacts the upper surface 20 at end 44 and permanent magnet layer 46 contacts the upper surface 20 at end 48.

Biasing is critical to the proper operation of the sensor 5. The hard bias 40 acts to stabilize the response of the sensor 5 and sets the quiescent state of the sensor. That is, the hard bias 40 stabilizes the domain structure of the free layer 18 to reduce noise. In CIP sensors, such as anisotropic magnetoresistive and spin valve devices, the hard bias 40 functions to set the magnetization of the free layer 18 in a longitudinal direction by pinning the magnetization at each end 22 of the free layer 18. This prevents formation of closure domains at the ends 22. Without this pinning, movement of the end domains can cause hysteresis in the magnetoresistive response of the device. Typically, in CIP devices the hard bias 40 is formed adjacent to and partially overlying the edges 22 of the free layer 18.

As can be seen in FIG. 1, on top of each permanent magnet layer 46 is a lead 50. The lead 50 is made of a conductive material, such as, gold, silver or copper. The lead 50 is laid on both sides of the sensor 5. The lead 50 has ends 52 which each contact the upper surface 20 of the free layer 18 and at or about the edges 22 of the free layer 18. In this manner, the leads 50 can provide an electrical current to and across the junction 10.

Flowing a current through the sensor allows changes in the magnetization of the adjacent magnetic media to be detected as changes in the electrical resistance of the sensor 5. This is because the free layer 18 is free to change its magnetic orientation in response to passing magnetized bits on the recording media. In other words, the magnetized bits on the recording media cause a change in the relative magnetization between the pinned layer 14 and the free layer 18. The change in magnetization causes the electrical resistance of the layer to change as well. Therefore, data can be read by measuring changes in the current passed through the sensor 5 as the recording media is passed by the sensor 5.

An improved type of sensor is the current-perpendicular-to-the-plane or CPP sensor. In a CPP sensor, such as a multilayer giant magnetoresistive (GMR) device or a spin dependent tunneling (SDT) device, the quiescent state of the device has antiparallel magnetic alignment of the magnetoresistive element layers for maximum resistance. In a CPP sensor, the current flows perpendicular to the planes of the layers of the sensor and not parallel as is the case with a CIP sensor. The increase in magnetoresistance (MR) values associated with CPP devices make the CPP sensors more sensitive and therefore allow for the use of smaller data bits, which increases the overall data storage of the disk.

Although the layering of the junction of a CPP sensor is similar to a CIP sensor, the positioning of the leads is completely different. Instead of positioning leads on each side of the device, CPP devices use a top lead positioned above the free layer and a bottom lead positioned below the antiferromagnet layer. Current flowing between the leads passes in a perpendicular manner through the layers of the CPP sensor.

Unfortunately, because of the perpendicular current flow of CPP devices, and because hard bias materials are electrically conductive, CPP devices cannot have the hard bias contacting the sides of the layers of the film stack as is the convention with CIP devices. If the hard bias is laid over the sides of the stack, the hard bias will cause electrical shorting between layers of the film stack to occur. Such shorting will dramatically reduce the performance of the CPP device or render it completely useless.

Thus, a CPP device is sought which is hard biased in a manner which will not cause shorting. Likewise, to produce such a hard biased CPP device, a method of fabrication is sought. The device must prohibit shorting and yet provide sufficient bias to properly pin the magnetization at each end of the free layer, so as to prevent formation of closure domains at the ends of the free layer and hysteresis in the magnetoresistive response of the device. The method must provide the fabrication of such a device in a manner which minimizes the cost and time of manufacture.

SUMMARY

The apparatus of the present invention is embodied in a magnetic field sensor having a magnetoresistive element, a magnetic bias layer for biasing the magnetoresistive element with a magnetic field, and an electrical insulator positioned between the magnetic bias layer and the magnetoresistive element. The insulator prevents the flow of electrical current between the magnetoresistive element and the magnetic bias layer and at least a portion of the insulator allows passage of the magnetic field from the magnetic bias layer to the magnetoresistive element.

In at least one embodiment, the electrical insulator has a lower insulator and an upper insulator which are in direct contact with one another, such that the magnetic bias layer is isolated from the magnetoresistive element. The upper and lower insulator are made of either $Al_2O_3$, $SiO_2$, $Ta_2O_5$ or $Si_3N_4$. The lower insulator has a thickness between 50 Å and 300 Å and the upper insulator a thickness between 300 Å and 1000 Å. The lower insulator is positioned between the magnetoresistive element and the magnetic bias layer and overlays at least a portion of the magnetoresistive element.

The magnetic bias layer overlays the lower insulator and the upper insulator overlays the magnetic bias layer. The magnetoresistive element has a top surface. The magnetic bias layer can have a tapered end. At least a portion of the tapered end overhangs the top surface of the magnetoresistive element. The magnetic bias layer has an underlayer and a magnetic layer which is positioned over the underlayer. The underlayer has a thickness between 50 Å–100 Å and can be made of either chromium or nickel aluminum. The magnetic layer has a thickness between 500 Å–2000 Å and can be made of either cobalt chromium, cobalt chromium platinum, cobalt chromium platinum tantalum, cobalt chromium tantalum or cobalt platinum. The magnetic bias layer has a $M_rT$ (the product of remanent magnetization and thickness) substantially equal to about 3 to 12 times the $M_rT$ of the magnetoresistive element.

The method of the present invention is embodied in a method for fabricating a magnetic field sensor having the steps of forming a magnetoresistive element, forming a lower insulator with a main section and an end section, over at least a portion of the magnetoresistive element, forming a magnetic bias layer over the main section of the lower insulator, and forming an upper insulator over the magnetic bias layer and over the end section of the lower insulator, such that the magnetic bias layer is electrically insulated from the magnetoresistive element.

In at least one embodiment of the method, when the magnetic bias layer is formed, it is shaped to have a tapered end, a portion of which can overhang the magnetoresistive element. The steps of forming the upper and lower insulators can be performed by deposition methods including ion beam sputtering, rf sputtering, reactive sputtering and chemical vapor deposition. The step of forming the underlayer of the magnetic bias layer can be performed by either ion beam deposition, rf sputtering, DC magnetron sputtering or electron beam evaporation. Similarly, the step of forming the magnetic layer can be performed by either ion beam deposition or DC magnetron sputtering.

In one embodiment of the method, the steps include depositing a film stack on a bottom lead, patterning the film stack and bottom lead, defining a magnetoresistive element with a top sensing layer from the film stack, depositing a lower insulator with a main section and an end section over a portion of the magnetoresistive element at least adjacent to the top sensing layer, depositing a magnetic bias layer over the main section of the lower insulator, depositing an upper insulator over the magnetic bias layer and over the end section of the lower insulator, and depositing a top lead over the magnetoresistive element such that the top lead is in contact with the lead portion of the top sensing layer. Where the magnetic bias layer which is deposited has a magnetic field sufficiently strong to magnetically bias the top sensing layer of the magnetoresistive element.

DETAILED DESCRIPTION OF THE PREFERRED EMBODIMENTS

In the preferred embodiments of the present invention, the apparatus of the invention is embodied in a current-perpendicular-to-the-plane or CPP magnetic field sensor and the method is embodied in a method of hard biasing for CPP magnetic field sensors. In both the apparatus and the method, the magnetic bias is isolated from the magnetoresistive element of the sensor by an electrical insulator. This insulation of the magnetic bias provides the significant advantage that the sensor is hard biased without any shorting between elements occurring.

Another advantage of the present invention is that hysteresis in the magnetoresistive response of the sensor can be prevented. Since the thickness of the insulator element is limited, the strength of the hard bias magnetic field is sufficient to the reach the edges of the free or sensing layer of the magnetoresistive element and set the magnetization of the layer. The magnetization of the layer is set by pinning the magnetization at each end of the free layer. This provides the benefits of preventing the formation of closure domains at the ends of the free layer and preventing hysteresis.

The present invention also provides the additional advantage of preventing shorting between elements through pinholes which may exist in the insulator layer. This advantage is achieved by keeping the thickness of the insulator above a defined minimum.

A further advantage is that the invention can be applied in a wide variety of CPP sensors including spin dependent tunneling (SDT) devices, CPP giant magnetoresistive (GMR) devices, and perpendicular spin valves. In addition, the invention can be applied in devices other than sensors, such as non-volatile memory cells.

Preferred Embodiments of the Apparatus of the Invention

Figure 1:
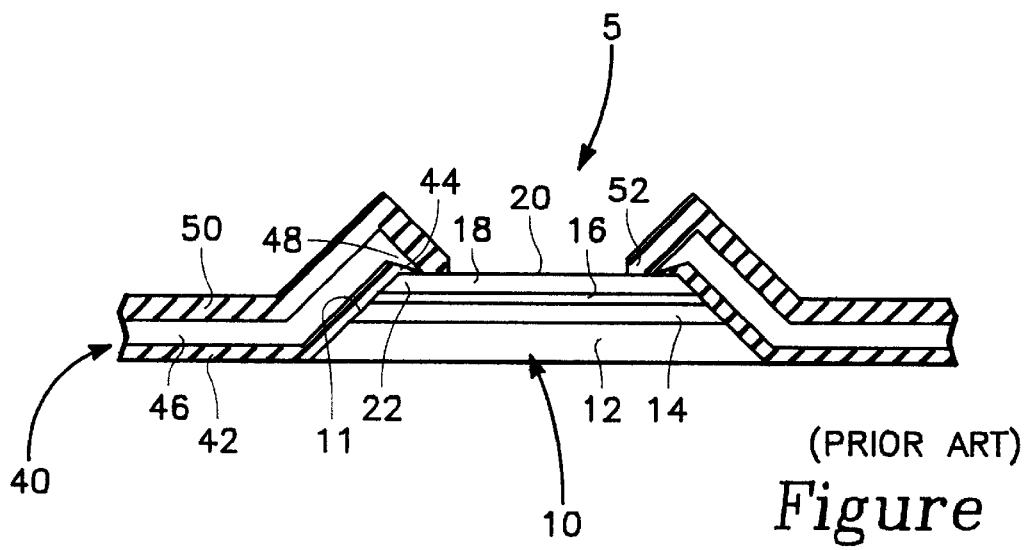
FIG. 1 is a side view showing a current-in-plane (CIP) device.
Figure 2:
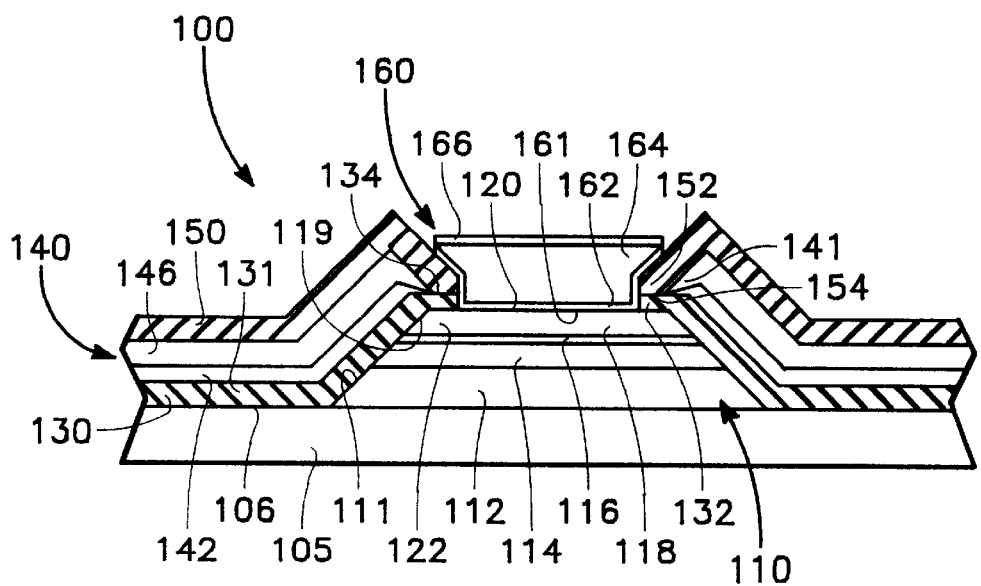
FIG. 2 is a side view showing an embodiment of the present invention.

By providing a hard bias for the sensing layer of a CPP device, the apparatus of the invention provides a stable sensor with increased sensitivity. FIG. 2 shows a side view of a preferred embodiment of the invention. Although a variety of devices can be employed, the embodiment shown in FIG. 2 is that of a SDT device. Other embodiments of the invention include CPP devices such as a CPP giant magnetoresistive (GMR) sensor or a perpendicular spin valve sensor. The sensor 100 of FIG. 2 includes bottom lead 105, magnetoresistive element or junction 110, lower insulator 130, magnetic or hard bias 140, upper insulator 150 and top lead 160.

The bottom lead 105 is a layer of conductive material which extends across the bottom of the sensor 100. The bottom lead 105 has an upper surface 106. The bottom lead 105 functions as a terminal to receive, or send, electrical current flowing from, or to, the top lead 160 through the junction 110. The bottom lead 105 can be made of a variety of conductive materials. However, it is preferably made of a multi-layer copper tantalum (Cu/Ta) or multi-layer copper gold (Cu/Au). Alternatively, the bottom lead can be a multi-layer copper chromium (Cu/Cr), a multi-layer gold chromium (Au/Cr) or a similar conductive material.

The junction 110 is a magnetoresistive element positioned on top of the bottom lead 105. In this embodiment the junction 110 has sloping sides 111. As shown in FIG. 2, the layering of the SDT embodiment of the junction 110 includes an antiferromagnet layer 112, a pinned layer 114, a tunneling barrier 116 and a free layer 118.

The antiferromagnet or AFM layer 112 is the bottom layer of the junction 110. It is preferred that the antiferromagnet layer 112 be made of iridium manganese (IrMn), platinum manganese (PtMn) or iron manganese (FeMn). Alternatively, the antiferromagnet layer 112 can be made of a multi-layer synthetic. The antiferromagnet layer 112 can have a thickness of 30 Å–200 Å, but it is preferred that the antiferromagnet layer 112 be about 100 Å thick. The antiferromagnet layer 112 functions to provide a base for the pinned layer 114.

As shown in FIG. 2, the pinned layer 114 is positioned directly above the antiferromagnet layer 112. The pinned layer 114 can be comprised of cobalt iron (CoFe), nickel iron (NiFe), cobalt (Co) or a Heusler alloy. The pinned layer 114 has a thickness of from 20 Å–100 Å, but it is preferred that the thickness is between 20 Å–50 Å. The pinned layer 114 functions to set a reference state for the free layer 118.

Directly above the pinned layer 114 is the tunneling barrier 116. The tunneling barrier 116 can be comprised of alumina ($Al_2O_3$), silicon oxide ($SiO_2$), tantalum oxide ($Ta_2O_5$) or aluminum nitride (AlN). It is preferred that alumina ($Al_2O_3$) is used. Compared to the other layers of the junction 110, the tunneling barrier 116 is relatively thin, having a preferred thickness in the range of 5–15 Å. Being positioned between the pinned layer 114 and the free layer 118, the tunneling barrier 116 functions to prevent shorting of the device 100 by filtering electrons.

The top layer of the junction 110 is the free or sensing layer 118. The free layer 118 is positioned on top of the tunneling barrier 116. The free layer 118 can have a thickness between 10 Å–100 Å, but the preferred thickness is between 20 Å–50 Å. Preferably, the free layer 118 is comprised of cobalt iron (CoFe), nickel iron (NiFe) or CoFe/NiFe. The free layer 118 functions to sense the position of the magnetic field created by the data bits located on an adjacent recording media. The free layer 118 performs this function by being free to change its magnetic orientation in response to a magnetic field of the magnetized data bits. As the magnetic orientation of the free layer 118 changes, the electrical resistance of the free layer 118, and thus of the device 100, is also changed. The measured changes in the electrical resistance can be converted to correspond to the data stored on the recording media.

As seen in FIG. 2, lower insulator 130 runs initially along and in contact with each side of the upper surface 106 of the bottom lead 105, and then up along and in contact with each side 111 of the junction 110. The lower insulator 130 has a main section 131 and an end section 132. At the top of the junction 110 each lower insulator 130 terminates at the end 132 above each edge 122 of the free layer 118. The lower insulator 130 extends onto the free layer upper surface 120 from each side 119 of the free layer 118, leaving an opening across the upper surface 120 large enough for the top lead 160 to sufficiently contact the upper surface 120. The end 132 of the lower insulator 130 has an end upper surface 134. The lower insulator 130 is made of an electrical insulator material. Preferably the lower insulator 130 is made of $Al_2O_3$, AlN, $SiO_2$, $Ta_2O_5$ or $Si_3N_4$. Alternatively, the lower insulator 130 can be made of magnesium oxide (MgO) or silicon carbide (SiC).

The lower insulator 130 is thick enough to prevent shorting between the hard bias 140 and either the top lead 160, the junction 110 or the bottom lead 105, due to defects, such as pinholes, in the insulator material. However, since the strength of the field produced by the hard bias 140 decreases as the distance between the hard bias 140 and the edge 122 of the free layer 118 increases, the thickness of lower insulator 130 is limited to that which will still allow a magnetic bias field strong enough to effectively reach and pin the edges 122. The maximum allowable thickness of the lower insulator 130 is dependent on the magnetic moment ($M_rT$) (remanent magnetization and thickness of the ferromagnetic hard bias) of the hard bias 140. The higher the magnetic moment, the thicker the lower insulator 130 can be. The lower the magnetic moment, the thinner the lower insulator 130 must be. The preferred thickness of the lower insulator 130 is at least 50 Å and no more than 300 Å.

Also shown in FIG. 2 is the hard bias 140. The hard bias 140 extends from each side of the sensor 100 over the lower insulator 130 and terminates at a tapered end 141, above each edge 122 of the free layer 118. The hard bias 140 has two layers, an underlayer or seed layer 142 and a permanent magnet layer 146. The underlayer 142 lays directly below the permanent magnet layer 146 and directly on top of the lower insulator 130. The underlayer 142 tapers at the tapered end 141 of the hard bias 140. The preferred materials for the underlayer 142 are chromium (Cr) and nickel aluminum (NiAl). Alternatively, nickel aluminum chromium (NiAlCr) or a chromium alloy could be used. The preferred thickness of the underlayer 142 is between 50 Å–100 Å, although the underlayer 142 can be thicker or thinner. The underlayer 142 functions as a seed layer for the permanent magnet layer 146. The underlayer 142 functions to obtain a preferred crystal orientation of the permanent magnet layer 146, which will maintain an in-plane magnetization of the permanent magnet layer 146. The permanent magnet layer 146 lies directly above the underlayer 142. Like the underlayer 142, the permanent magnet layer 146 tapers at the tapered end 141. The permanent magnet layer 146 functions to provide a magnetic field to pin the edges 122 of the free layer 118. The material of the permanent magnet layer has a high coercivity (Hc) to provide sufficient stability during operation.

The permanent magnet layer 146 can be cobalt chromium (CoCr), cobalt chromium platinum (CoCrPt), cobalt chromium platinum tantalum (CoCrPtTa), cobalt chromium tantalum (CoCrTa) or cobalt platinum (CoPt). However, it is preferred that cobalt chromium platinum is used. Also, it is preferred that the magnetic moment ($M_rT$) of the hard bias layer 140 be set to match about 3 to 12 times the magnetic moment of the free layer 118. To account for the insulator set between the free layer 118 and the hard bias layer 140, the magnetic moment of the hard bias layer 140 can be set higher than the magnetic moment of the free layer 118. The amount of this increase in magnetic moment is dependent on the type and thickness of the insulator and can be determined by known analytical or empirical methods. As such, the preferred thickness of the hard bias layer 140 is a function of the magnetic moment of the free layer 118, the effect of the insulator and the remanent magnetization ($M_r$) of the material of the hard bias layer 140.

As shown in FIG. 2, the upper insulator 150 extends from each side of the sensor 100 over the hard bias layer 140. At a lower surface 154 of an end 152, the upper insulator 150 contacts the upper surface 134 of the end 132 of the lower insulator 130. In so doing, the upper insulator 150 and the lower insulator 130 encapsulate the hard bias 140 and electrically isolate hard bias 140 from the bottom lead 105, the junction 110 and the top lead 160. The upper insulator 150 is made of an electrical insulating material. Preferably the upper insulator 150 is made of $Al_2O_3$, $SiO_2$, $Ta_2O_5$ or $Si_3N_4$. Alternatively, the upper insulator 150 can be made of magnesium oxide (MgO) or silicon carbide (SiC). The thickness of the upper insulator 150 is preferably between 300 Å and 1000 Å.

The top lead 160 is positioned directly over and in contact with the free layer 118. A lower surface 161 of top lead 160 contacts the upper surface 120 of the free layer 118. The top lead 160 is positioned between the insulating layers 130 and 150, which surround the hard bias 140. The top lead 160 is made of a conductive material. Although a variety of materials can be used, the preferred material for top lead 160 is a layering of tantalum/gold/tantalum (Ta/Au/Ta). Alternatively, the top lead 160 can be made of copper or silver. Top lead 160 functions to send or receive an electrical current through the junction 110 to or from the bottom lead 105. With the top lead 160 and the bottom lead 105 positioned at the top and bottom of the junction 110 respectfully, the electrical current passing between the leads crosses through the junction 110, substantially perpendicular to the planes of each layer of the junction 110.

In an alternative embodiment of the invention, the device 100 is used in a non-volatile memory instead of a magnetic recording head sensor. In such an application, the invention is employed to stabilize the free layer of a memory element. When used in a non-volatile memory, the configuration of the device 100 is the same as describe above, but its operation is different. That is, instead of sensing the magnetic field of data bits passing on an adjacent recording media, the device 100 senses the magnetic field generated by an adjacent conductive line. As the current flowing in the conductive line changes direction, the free layer aligns itself with the new magnetic field of the line. This change in alignment of the free layer causes a change in the resistance of the free layer and thus a change in the resistance of the device 100. The resistance change is measured and the state of the memory element determined. Since the free layer retains its orientation even after the current in the adjacent line stops flowing, the memory is non-volatile.

PREFERRED EMBODIMENTS OF THE METHOD OF THE INVENTION

The preferred embodiments of the method of present invention provides an advantageous means for fabricated the apparatus of the invention. The preferred embodiment of the method of the invention includes depositing the film stack 200, patterning the bottom lead 210, defining the junction 220, depositing the lower insulator 230, depositing of the hard bias layer 240, depositing the upper insulator 250, opening the via by lift-off of the bi-layer photoresist 260, creating the top lead 270. These steps are illustrated in the fabrication of the device 100 as shown in FIGS. 3–9. Also, FIG. 10 shows a chart of the steps of this embodiment of the method of the invention.

Figure 3:
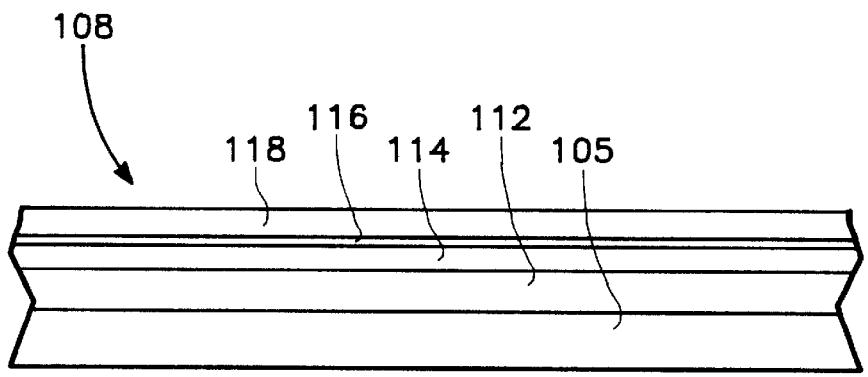
FIG. 3 is a side view showing the film stack and bottom lead of an embodiment of the present invention.

The first step of a preferred embodiment of the method is depositing the film stack 200. Shown in FIG. 3 is the preferred layering of the film stack 108 which results from the depositing step 200. As can be seen, the preferred layering of the film stack 108 is that which provides a spin dependent tunneling (SDT) device. However, alternative layers can be used for film stack 108, such as those which provide CPP giant magnetoresistive (GMR) devices or perpendicular spin valves devices.

FIG. 3 shows a side view of the film stack 108 after depositing the layers. As can be seen, the film stack 108 is deposited on top of a previously deposited bottom lead 105, which rests upon a wafer (not shown). The layering of the film stack 108 for a SDT device includes, starting from the bottom, an antiferromagnet layer 112, a pinned layer 114, a tunneling barrier 116 and a free layer 118. The process of depositing the film stack 108 is one which is well known in the art.

The antiferromagnet layer 112 is the bottom layer of the film stack 108. The antiferromagnet layer 112 is the first of the layers in the film stack 108 to be deposited and is deposited directly onto the bottom lead 100. The antiferromagnet layer 112 can be deposited by ion beam deposition or sputtering.

As shown in FIG. 3, after the antiferromagnet layer 112 is deposited, the pinned layer 114 is put down directly on top of the antiferromagnet layer 112. The pinned layer 114 can be deposited by ion beam deposition or sputtering.

Next, deposited on the pinned layer 114 is the tunneling barrier 116. The tunneling barrier 116 separates the pinned layer 114 and the free layer 118. The preferred method of depositing the tunneling barrier 116 is by sputtering of metallic aluminum and then applying oxygen or oxygen plasma to oxidize the aluminum.

The last layer of the film stack 108 to be deposited is the free layer 118. The free layer 118 is deposited directly onto the tunneling barrier 116, as shown in FIG. 3. As noted above, the free layer 118 functions to sense the position of the magnetic field created by the data bits on the recording media. The width of the free layer 118 corresponds to the width of the track of the recording media which will be read by the sensor. The free layer 118 is preferably deposited by ion beam deposition or sputtering.

The next step of a preferred embodiment of the method is the patterning of the bottom lead 210. During this step, the film stack 108 and the bottom lead 105 are patterned with methods of photolithography and ion milling which are well known in the art. The patterning of the bottom lead 105 allows pathways for the electrical current traveling to, or from, the sensor 100 to be established. In an alternative embodiment of the method, the bottom lead 105 is patterned before the film stack 108 is deposited. As such, the step of patterning the bottom lead 210 will occur before the step of depositing the film stack 200.

The next step of this embodiment of the method is defining the junction 220. This step includes the steps of photolithography 222 and milling the film stack 224. These steps are shown FIGS. 4a and b.

The step of photolithography 222 involves a process well known in the art. It is preferred that the photolithography step involve applying a bi-layer photoresist 300. The process of the applying the bi-layer photoresist includes applying a first photoresist layer 302 to the upper surface 120 of the free layer 118, and then applying a second layer 304 of photoresist on top of the first layer 302. Next, in one embodiment, a mask is placed over the top of portions of the bi-layer photoresist 300 and the portions of the photoresist 300 not covered by the mask are exposed to a light source, making the exposed portions of the photoresist soluble to developer. Then, the mask is removed and the unexposed portions of the photoresist are removed with a developer, leaving only the exposed portions on the film stack 108.

Figure 4A:
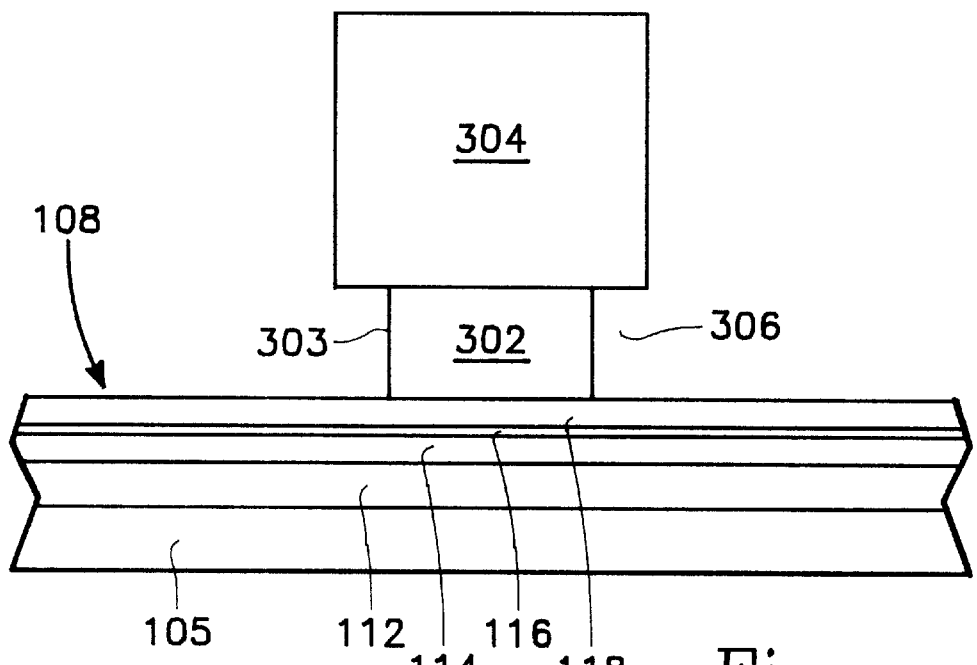
FIGS. 4a–b are side views showing a photoresist applied to the film stack and a magnetoresistive element defined from the film stack of an embodiment of the present invention.

FIG. 4a shows the bi-layer photoresist 300 which has been applied to the film stack 108. Since the first layer 302 is of a photoresist material which reacts quicker to the application of the developer than the material of the second layer 304, an undercut 306 is formed as the first layer 302 is dissolved. This leaves the second layer 304 extending further on each side of the photoresist 300 than the first layer 302. The size of the undercut 306 can be controlled by the time which the developer is applied to the bi-layer photoresist 300. The longer the developer is applied, the more the first layer 302 will be removed relative to the second layer 304 and the deeper the undercut 306 will be.

Figure 4B:
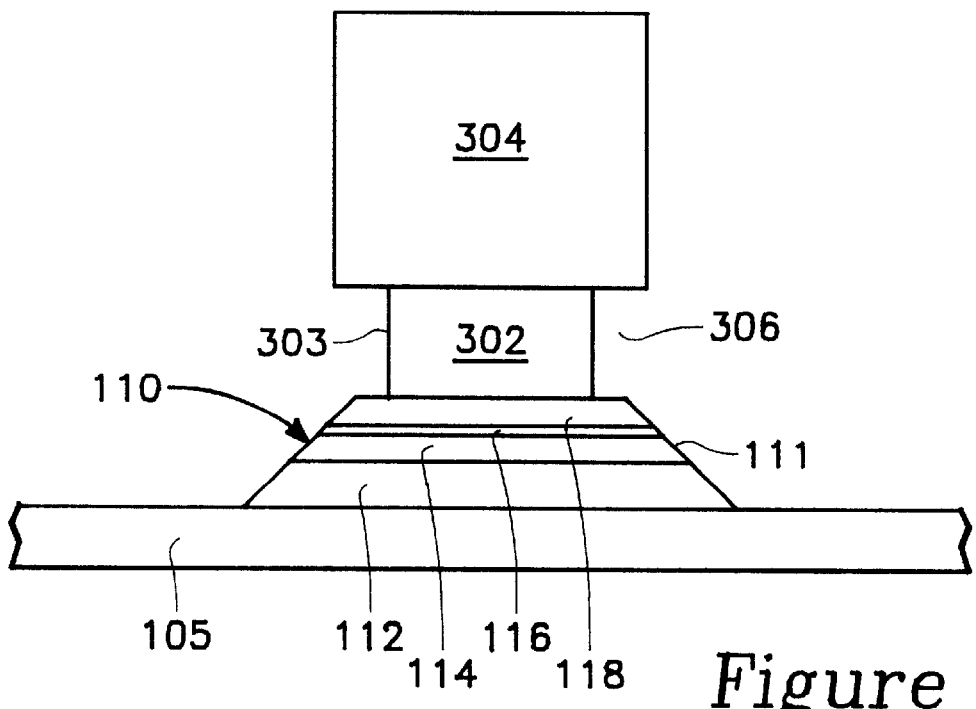

The next step in defining the junction 220 is milling the film stack 224. During this step the junction 110 is defined by using ion milling to etch away the undesired portions of the film stack 108. FIG. 4b shows a completed junction 110. The ion milling is of a process well known in the art. During the ion milling, portions of the film stack 108, located outward from the bi-layer photoresist 300, are etched away. The ion beam is directed at an angle (typically about 5 degree from the vertical) relative to the normal of the plane of the film stack 108 and the device 100 is rotated relative to the ion beam. In this manner, portions of the film stack 108 fall within the shadow of the photoresist 300 and the film stack 108 is etched with sloping sides 111, as shown in FIG. 4b. During this etch process a relatively small amount of the antiferromagnet layer 112 may be left extending out over the bottom lead 105. Alternatively, a relatively small amount of the upper portion of the bottom lead 105 may be etched away. Another method defining the junction 110 is by reactive ion beam etching (RIE).

Figure 5:
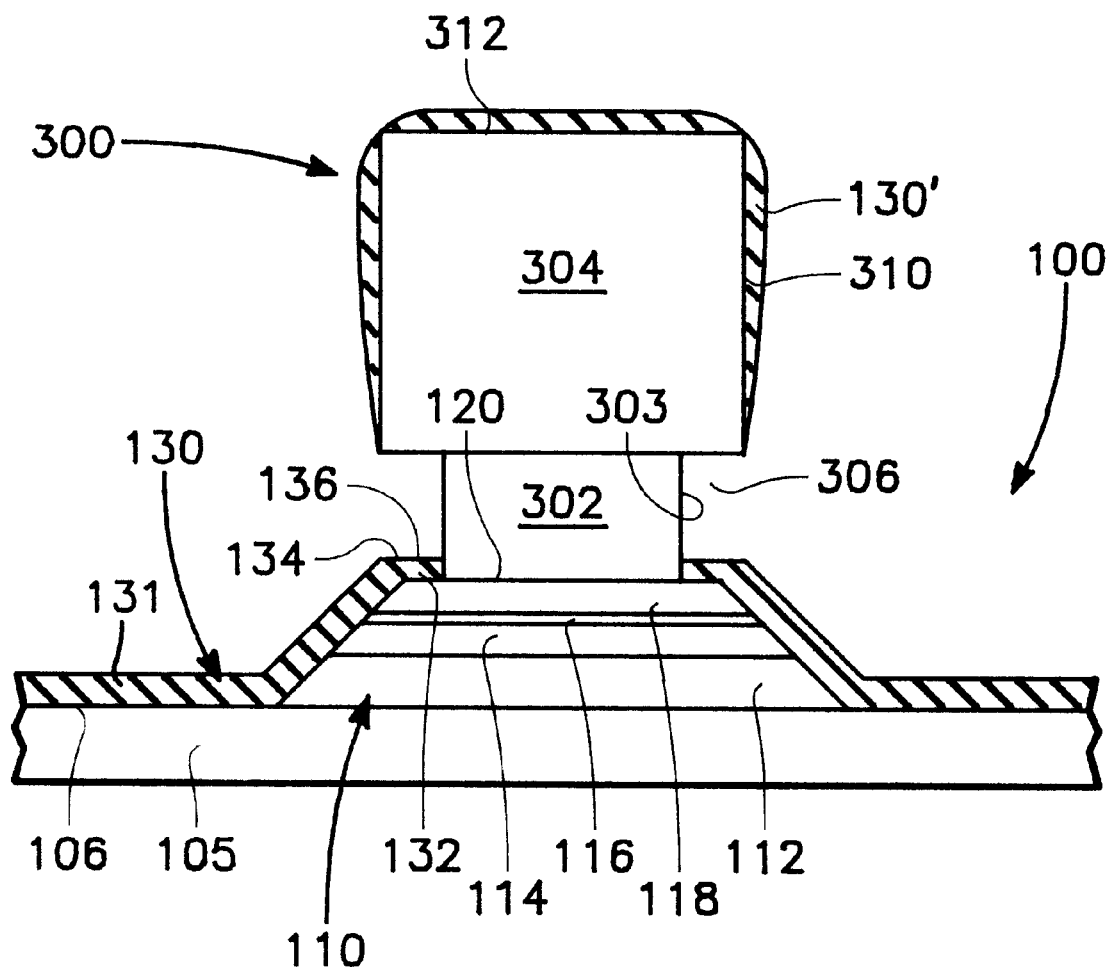
FIG. 5 is a side view showing the lower insulator applied over the magnetoresistive element and bottom lead of an embodiment of the present invention.

The next step in this preferred embodiment of the method, is depositing the lower insulator 230. The completed deposition of the lower insulator 130 is shown in FIG. 5. Preferable insulator materials for insulator 130 include $Al_2O_3$, AlN, $SiO_2$, $Ta_2O_5$ or $Si_3N_4$. Alternative materials include magnesium oxide (MgO) and silicon carbide (SiC). A variety of methods of deposition can be used to deposit the lower insulator 130 including ion beam sputtering (low angle), rf sputtering, reactive sputtering and chemical vapor deposition (CVD). However, the preferable method of deposition is rf sputtering, which is a method well known in the art. Depositing lower insulator 130 by rf sputtering or reactive sputtering provides a longer overlay 136 under the undercut 306 of the bi-layer photoresist 300. The longer overlay 136 provides a more constant thickness of the lower insulator 130 under the undercut 306. To avoid shorting in the device 100, it is important that the thickness of the lower insulator 130 is maintained along its entire length above a minimum thickness. As previously noted, the preferable minimum thickness of lower insulator 130 is between 50 Å and 300 Å. As seen in FIG. 5, the lower insulator 130 is located on both sides of the device 100. Lower insulator 130 covers the upper surface 106 of bottom lead 105, the sides 111 of junction 110 and the portion of the upper surface 120 of the free layer 118, which is not otherwise covered by the bi-layer photoresist 300. The lower insulator has a main portion 131 and an end 132.

As also seen in FIG. 5, as a result of the rf sputtering or reactive sputtering, the sides 310 and the upper surface 312 of the bi-layer photoresist 300 are covered by lower insulator material 130'. However, the undercut 306 keeps the sides 303 of the first photoresist layer 302 free of the lower insulator material 130', aiding later lift-off of the bi-layer photoresist 300.

Figure 6A:
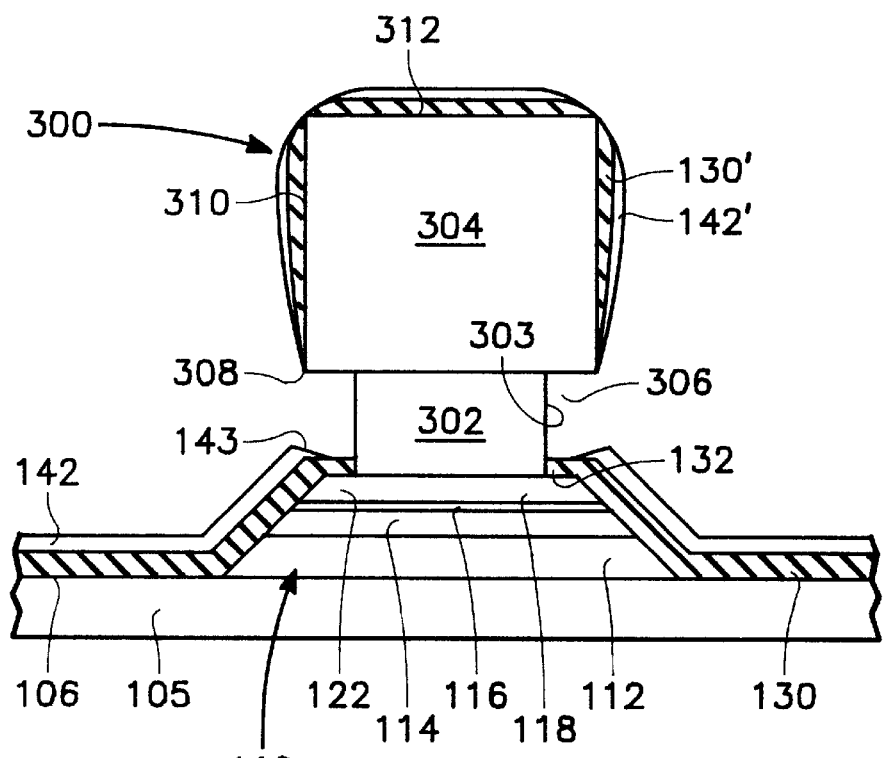
FIGS. 6a–b are side views showing the magnetic bias layer applied over the lower insulator of an embodiment of the present invention.
Figure 6B:
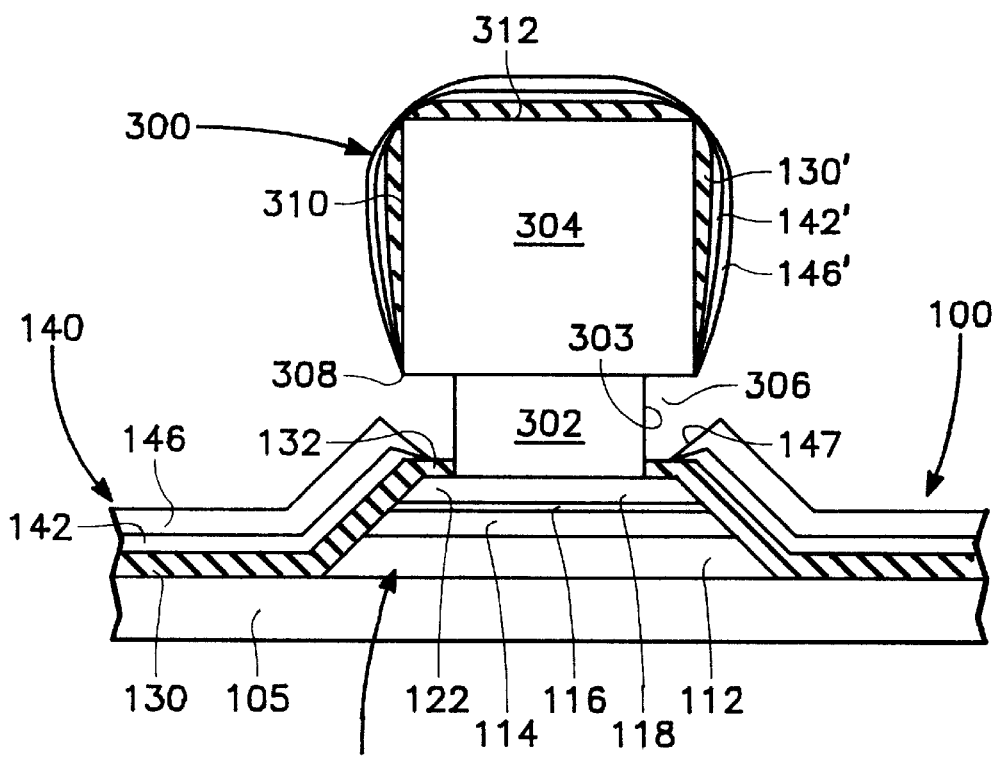

The next step of this preferred embodiment of the method is depositing the hard bias layer 240. The hard bias layer 140 includes underlayer 142 and permanent magnet layer 146. FIGS. 6a and 6b show the deposition of both these layers.

The step of depositing of the hard bias layer 240 includes the steps of depositing the underlayer 242 and the step of depositing the permanent magnet layer 246. In the first step, depositing the underlayer 242, the underlayer 142 is deposited on top of the lower insulator 130, as shown in FIG. 6a. It is preferred that the underlayer 142 be of either Cr or NiAl. However, other materials can be used, such as, CrV, CrTi or chromium alloys. Also, it is preferred that the underlayer 142 be deposited by ion beam deposition (IBD). Alternative methods of deposition include rf sputtering, DC magnetron sputtering and electron beam evaporation. By using the overhang edge 308 of the second photoresist layer 304 to produce a shadow under the undercut 306, and by controlling the direction and angle of the ion beam, the ion beam deposition of the material of underlayer 142 provides a short overlay 143 under the undercut 306 of the bi-layer photoresist 300. That is, by angling the ion beam about the overhang edge 308, the deposition of the material of the underlayer 142 is controlled to cause the underlayer 142 to taper (in thickness), as it progresses from outside the undercut 306 in towards the sides 303 of the first layer 302 of the bi-layer photoresist 300. Under the undercut 306 the underlayer 142 can be deposited to terminate at a zero or near zero thickness. The taper of the underlayer 142 is shown in FIG. 6a.

It is preferred that the underlayer 142 ends out away from each end 132 of the lower insulator 130 a distance of between 100 Å and 300 Å. With the lower insulator 142 terminating away from the end 132 of the lower insulator 130, the upper insulator 150 can later be applied directly onto the upper surface 134 of the end 132 of the lower insulator 130. This provides a continuous insulator to separate the underlayer 142 from the top lead 160, the junction 110 and the bottom lead 105.

Therefore, with the underlayer 142 at between 100 Å and 300 Å away from each end 132, shorting will be prevented and the magnetic field of the hard bias layer 140 will be strong enough to reach to the edges 122 of the free layer 118 and sufficiently pin the magnetization of the edges 122. As such, the tapering allows the underlayer 142 to be positioned close to the edges 122 of the free layer 118 but still be insulated by the lower and upper insulator layers 130 and 150.

As can be seen in FIG. 6a, as the underlayer material is applied by ion beam deposition, the sides 310 and upper surface 312 of the bi-layer photoresist 300 are covered by underlayer material 142'. However, as the undercut 306 keeps the sides 303 of the first photoresist layer 302 free of the underlayer material 142', later lift-off of the bi-layer photoresist 300 is facilitated.

The next in the step of depositing of the hard bias layer 240 is depositing the permanent magnet layer 246. In this step, the permanent magnet layer 146 is deposited on both sides of the device 100 over the underlayer 142, as shown in FIG. 6b. The permanent magnet layer 146 can be made of CoCrPt, CoCrPtTa or CoPt, but it is preferred that the material be CoCrPt. Also, it is preferred that the permanent magnet layer 146 be deposited by ion beam deposition (IBD). Alternatively, the permanent magnet layer 146 can be deposited by DC magnetron sputtering. As with the deposition of the underlayer 142, by controlling the angle of the ion beam and by using the overhang 308 to provide a shadow, a short overlay, under the undercut 306 of the permanent magnet layer 146, is created. Like with the underlayer 142, the permanent magnet layer 146 also tapers down under the undercut 306, to a short overlay 147. The tapering allows the permanent magnet layer 146 to be positioned close to the edges 122 of the free layer 118, but still be insulated by the lower insulator 130 and the upper insulator 150. It is preferred that the permanent magnet layer 146 ends out away from each end 132 of the lower insulator 130 a distance of between 100 Å and 300 Å. With the permanent magnet layer 146 terminating at between 100 Å and 300 Å from the ends 132, shorting will be prevented and the magnetic field will be strong enough to reach to the edges 122 of the free layer 118 and pin the magnetization of the edges 122.

By having the permanent magnet layer 146 separated from the junction 110, the bottom lead 105 and the top lead 160 by both the lower insulator 130 and the upper insulation 150, the permanent magnet layer 146 will not cause the device 100 to short. Any reduction of the hard bias field caused by the lower insulator 130 and upper insulators 150, is compensated by increasing $M_rT$ (the product of remanent magnetization and thickness of ferromagnetic hard bias) of the hard bias layer 140 relative to that which would be used for a non-insulated hard bias device, such as a CIP sensor.

FIG. 6b also shows that as the permanent magnet layer 134 is applied, the sides 310 and upper surface 312 of the bi-layer photoresist 300 are covered by permanent magnet material 146'. As with the application of the prior layers of material, the undercut 306 keeps the sides 303 of the first photoresist layer 302 free of the permanent magnet material 146'. This allows for easier later lift-off of the bi-layer photoresist 300.

Figure 7:
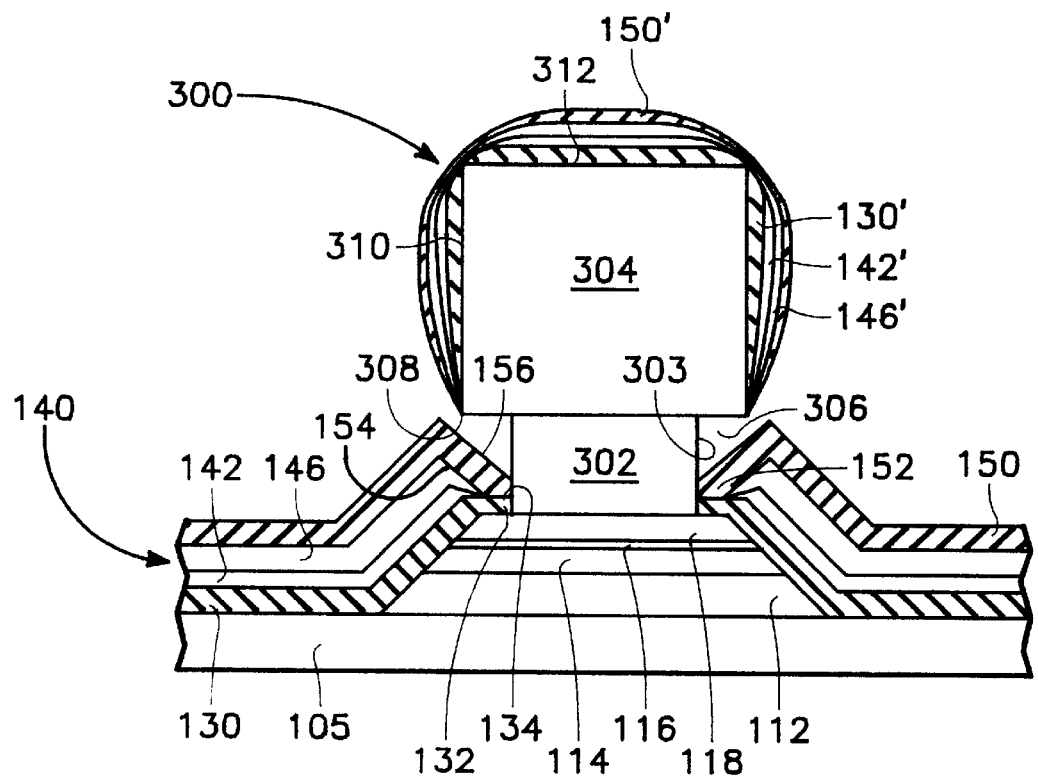
FIG. 7 is a side view showing the upper insulator applied over the permanent magnet layer of an embodiment of the present invention.

In the preferred embodiments of the method the next step is depositing the upper insulator 250. In this step, the upper insulator 150 is deposited over the top of the permanent magnet layer 146, as shown in FIG. 7. In addition to laying over the top of the permanent magnet layer 146, the lower surface 154 of the end 152 of the upper insulator 150, directly contacts the upper surface 134 of the end 132 of the lower insulator 130. With the upper insulator 150 contacting the lower insulator 130, the hard bias 140 is encapsulated and electrically insulated from the bottom lead 105, the junction 110 and the top lead 160 (not shown). This eliminates shorting between the elements and noise resulting from contact of the hard bias 140 with the free layer 118. The upper insulator extends up against a portion of the sides 303 of the first photoresist layer 302.

Preferable materials for upper insulator 150 are $Al_2O_3$, $SiO_2$, $Ta_2O_5$ or $Si_3N_4$. Alternative materials include magnesium oxide (MgO) and silicon carbide (SiC). However, to ease the fabrication of the device 100 it is preferred that the material used for the upper insulator 150, be the same as that used for the lower insulator 130. The deposition of the upper insulator 150 is similar to the deposition of lower insulator 130, except thickness of the layer can be greater. A preferred thickness of upper insulator 150 is between 300 Å–1000 Å. The preferable method of depositing upper insulator 150 is rf sputtering. Alternative deposition methods include reactive sputtering, ion beam sputtering (low angle) and chemical vapor deposition (CVD). These methods are well known in the art. Rf sputtering or reactive sputtering provides longer overlay 156 of the upper insulator 150 under the undercut 306.

As a result of the rf sputtering or reactive sputtering, the sides 310 and upper surface 312 of the bi-layer photoresist 300 are covered by upper insulator material 150'. This is shown in FIG. 7. However, the undercut 306 keeps the sides 303 of the first photoresist layer 302 free of the upper insulator material 150'. This aids in the later lift-off of the bi-layer photoresist 300.

Figure 8:
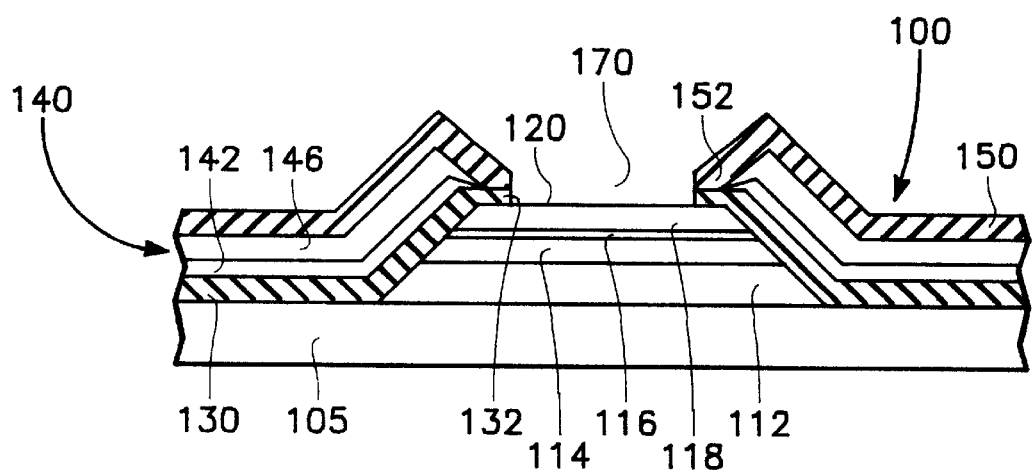
FIG. 8 is a side view showing the photoresist removed from an embodiment of the present invention.
Figure 9A:
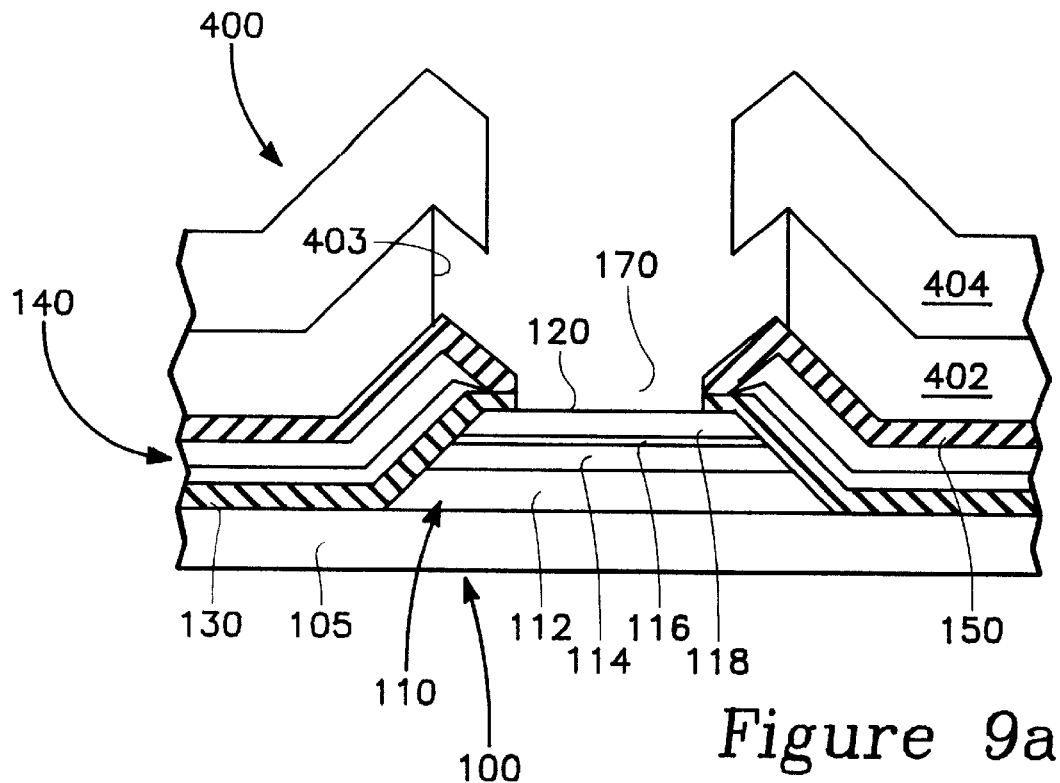
FIGS. 9a–b are side views showing the application of the upper lead of an embodiment of the present invention.

The next step of the preferred embodiments of the method is opening the via by lift-off of the bi-layer photoresist 260. The device 100 with the bi-layer photoresist 300 removed is shown in FIG. 8. During this step, the bi-layer photoresist 300 is removed from the device 100. The bi-layer photoresist 300 is removed by a method well known in the art involving the use of a stripper, such as NMP, with ultrasound applied at a temperature of 85–90° C., to dissolve and dislodge the photoresist materials. Because the first layer photoresist 302 is a quicker developing material than the second layer 304, and because the sides 303 of the first layer 302 are not covered by excess layering material (insulators 130' and 150' and hard bias 140'), the first layer 302 will dissolve quicker when a stripper is applied then the second layer 304 will. The dissolving of the first layer 302 will, after a period of time, cause the remaining portion of the bi-layer photoresist 300 to separate from the device 100. Leaving the device 100 with an open via 170 along the upper surface 120 of free layer 118, as shown in FIG. 8. The via 170 is positioned between both ends 132 of the lower insulators 130 and between both ends 152 of the upper insulators 150. The via 170 is opened to allow the top lead 160 (not shown) to be deposited.

For the preferred embodiments of the method, the final step is creating the top lead 270. This step includes the steps of top lead patterning by photolithography 272, depositing the top lead 274, and lift-off of the top lead photoresist masking 276. These step of patterning the top lead are shown in FIGS. 9a–b and FIG. 2.

The first step of creating the top lead 270 is to pattern the top lead by photolithography 272. The patterning of the top lead can be done by bi-layer photoresist masking. As before with application of the bi-layer photoresist 300, the application of a top lead bi-layer photoresist 400 is performed by a photoresist masking method well known in the art. However, as is shown in FIG. 9a, instead of being positioned above the junction 110 as the photoresist 300 was, the bi-layer photoresist 400 is positioned on both sides of the via 170. With the bi-layer photoresist 400 so positioned, the top lead material can be deposited in the via 170. As shown in FIG. 9a, the bi-layer photoresist 400 has a first layer 402, which is deposited directly on top of the upper insulator 140, and a second layer 404 which is deposited directly on top of the first layer 402. Each first layer 402 has a side 403. The first layer 402 is made of a quicker developing photoresist material then that of the second layer 404. The second layer 404 extends further inward on both sides than the first layer 402 does. This creates undercuts 406, as seen in FIG. 9a.

The next step in creating the top lead 270 is depositing of the top lead 274. With the bi-layer photoresist 400 in place, the top lead 160 can be deposited directly on the upper surface 120 of the free layer 118 by magnetron sputtering, rf sputtering or ion beam sputtering. These deposition processes are well known in the art. The preferred material for the top lead is tantalum/gold/tantalum (Ta/Au/Ta). First, a tantalum layer 162 is deposited as a seed layer, providing improved adhesion compared to that of a gold only lead. Next, a gold layer 164 will be applied on top of the tantalum layer 162. Lastly, another tantalum layer 166 layer will be applied on top of the gold layer 164 to improve the adhesion for other later added structures. It is preferred that the tantalum layers 162 and 166 be about 100 Å thick and the gold layer 164 about 600 Å thick. Alternative materials for the top lead 160 include gold, silver, copper or any other similar conductive material.

Figure 9B:
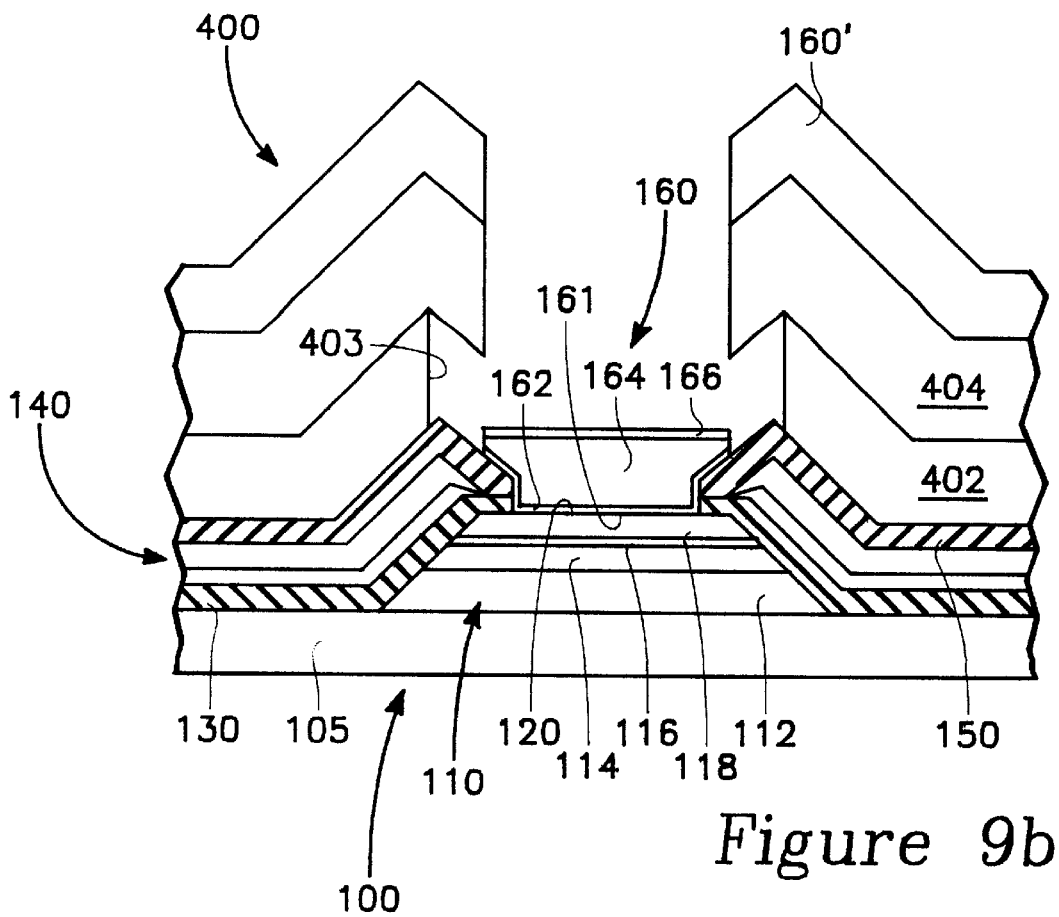
Figure 10:
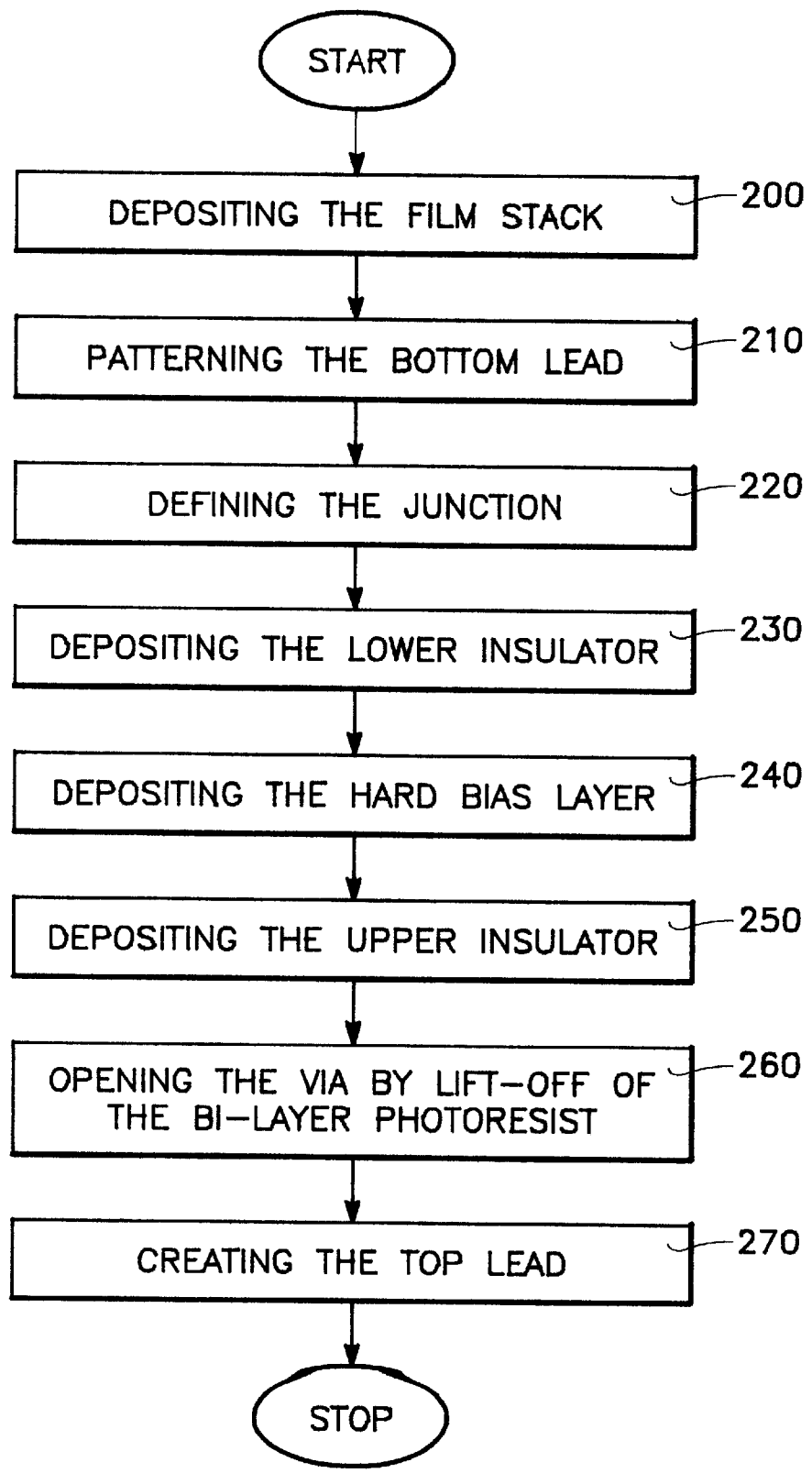
FIG. 10 is a flow diagram illustrating a method of the present invention.

FIG. 9b shows the device 100 with the top lead 160 deposited on top of the free layer 118. As can be seen, excess top lead material 160' is deposited on the top of each second layer 404. The undercut 406 acts to prevent build-up of the excess top lead material 160' from collecting on the sides 403 of the first layer 402. Keeping the sides 403 accessible by the stripper used during lift-off, aiding lift-off of the photoresist 400.

The last step of the creation of the top lead 270 is lift-off of the top lead photoresist masking 276. The lift-off of the photoresist 400 is performed in the same well known in the art process as that of the lift-off of the photoresist 300. That is, a stripper is used on the photoresist 400 and the first layer 402 is dissolved quicker than the second layer 404. FIG. 2 shows the device after the lift-off of the photoresist 400.

After the top lead 160 has been created, the device 100 can be included in the fabrication of a read/write head assembly. During or after such a fabrication, the device 100 will typically be connected to a separate device used to read the changes in resistance across the junction 110 as the orientation of the free layer is changed by the magnetic fields of the data bits of the passing recording media.

While the invention has been described in detail by specific reference to preferred embodiments, it is understood that the above description is not limiting of the disclosed invention and variations and modifications thereof may be made without departing from the true spirit and scope of the invention.

What is claimed is:

1. A magnetic field sensor comprising:
   A. a magnetoresistive element;
   B. a magnetic bias layer for biasing the magnetoresistive element with a magnetic field; and
   C. an electrical insulator positioned between the magnetic bias layer and the magnetoresistive element, wherein the insulator prevents a flow of electrical current between the magnetoresistive element and the magnetic bias layer, wherein at least a portion of the insulator allows passage of the magnetic field from the magnetic bias layer to the magnetoresistive element.

2. The magnetic field sensor of claim 1, wherein the electrical insulator further comprises a lower insulator and an upper insulator, wherein the lower insulator is in direct contact with the upper insulator.

3. The magnetic field sensor of claim 2, wherein the lower insulator is positioned between the magnetoresistive element and the magnetic bias layer and wherein the lower insulator allows passage of the magnetic field from the magnetic bias layer to the magnetoresistive element.

4. The magnetic field sensor of claim 3, wherein the lower insulator overlays at least a portion of the magnetoresistive element, wherein the magnetic bias layer overlays the lower insulator and wherein the upper insulator overlays the magnetic bias layer.

5. The magnetic field sensor of claim 4, wherein the magnetoresistive element has a top surface, wherein the magnetic bias layer has a tapered end, wherein at least a portion of the tapered end overhangs the top surface of the magnetoresistive element.

6. The magnetic field sensor of claim 3, wherein the lower insulator is comprised of a material from the group of $Al_2O_3$, AlN, $SiO_2$, $Ta_2O_5$ and $Si_3N_4$, and wherein the lower insulator has a thickness between 50 Å and 300 Å.

7. The magnetic field sensor of claim 6, wherein the magnetic bias layer further comprises an underlayer and a magnetic layer positioned on top of the underlayer, wherein the underlayer has a thickness between 50 Å–100 Å and is comprised of a material from the group of chromium and nickel aluminum, and wherein the magnetic layer has a thickness between 500 Å–200 Å and is comprised of a material from the group of cobalt chromium, cobalt chromium platinum, cobalt chromium platinum tantalum, cobalt chromium tantalum and cobalt platinum.

8. The magnetic field sensor of claim 7, wherein the upper insulator is comprised of a material from the group of $Al_2O_3$, $SiO_2$, $Ta_2O_5$ and $Si_3N_4$, and wherein the upper insulator has a thickness between 300 Å and 1000 Å.

9. The magnetic field sensor of claim 1, wherein the magnetic bias layer has a $M_rT$ substantially equal to about 3–12 times a $M_rT$ of the magnetoresistive element.

* * * * *